US009560780B2

(12) United States Patent
Kuno et al.

(10) Patent No.: US 9,560,780 B2

(45) Date of Patent: Jan. 31, 2017

(54) ELECTRONIC DEVICE

(71) Applicant: BROTHER KOGYO KABUSHIKI KAISHA, Nagoya-shi, Aichi (JP)

(72) Inventors: Yohei Kuno, Nagoya (JP); Shumei Mori, Ichinomiya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 0 days.

(21) Appl. No.: 15/016,598

(22) Filed: Feb. 5, 2016

(65) Prior Publication Data

US 2016/0229180 A1 Aug. 11, 2016

(30) Foreign Application Priority Data

Feb. 5, 2015 (JP) ................................ 2015-020789

(51) Int. Cl.

| | |
|---|---|
| ***B41J 2/165*** | (2006.01) |
| ***H05K 5/02*** | (2006.01) |
| ***B41J 29/02*** | (2006.01) |
| ***B41J 29/13*** | (2006.01) |

(52) U.S. Cl.

CPC ............ *H05K 5/0239* (2013.01); *B41J 29/02* (2013.01); *B41J 29/13* (2013.01)

(58) Field of Classification Search

None

See application file for complete search history.

(56) References Cited

U.S. PATENT DOCUMENTS

| | | | | |
|---|---|---|---|---|
| 5,487,123 A * | 1/1996 | Fowble | ................ | G02B 6/3897 385/137 |
| 2006/0250426 A1* | 11/2006 | Wanibe | ................ | B41J 2/17566 347/7 |
| 2014/0085366 A1 | 3/2014 | Mori et al. | | |

FOREIGN PATENT DOCUMENTS

| | | |
|---|---|---|
| JP | 2014-069342 A | 4/2014 |

* cited by examiner

*Primary Examiner* — Alejandro Valencia

(74) *Attorney, Agent, or Firm* — Fox Rothschild LLP

(57) ABSTRACT

A memory module has a memory mounted thereon. A support plate supports a circuit board. The circuit board is located facing and separated from the support plate. The circuit board has a first contact. A holder has a recessed housing portion and a first engagement portion. The housing portion is formed to internally house the memory module. The first engagement portion is provided to be inserted into an opening and engage with the opening. The holder is configured to be fixed to the support plate in an attitude in which the housing portion is open toward the circuit board, by the first engagement portion engaging with the opening. A lid is mounted on the holder by being inserted into the housing portion. A conductive portion is provided on the lid. The conductive portion is configured to electrically connect the memory module to the first contact of the circuit board.

9 Claims, 10 Drawing Sheets

ELECTRONIC DEVICE

CROSS-REFERENCE TO RELATED APPLICATION

This application claims priority to Japanese Patent Application No. 2015-020789 filed on Feb. 5, 2015, the disclosure of which is herein incorporated by reference in its entirety.

BACKGROUND

The present disclosure relates to an electronic device.

A printer is known in which heads that discharge ink are mounted on a carriage and print is performed while the carriage is moved relative to a cloth that is retained on a platen. A main board is provided inside the printer. At least a CPU, a memory such as a ROM and a RAM, and an input/output terminals etc. are mounted on the main board. Various software programs relating to control of the printer, a model code of the printer, print data, and various parameters etc. are stored in the memory.

SUMMARY

When, for example, the printer is improved and a number of mounted heads is increased, it may be wished to additionally install a memory, on which a model code of the printer after improvement is stored, on the main board. However, the size of the main board is restricted in terms of the space provided inside the printer. Thus, even if it is wished to additionally install a memory on the main board using a soldering iron or a joint etc., there may not be space on the surface of the main board to allow the additional installation.

Various embodiments of the general principles described herein provide an electronic device having good mountability of a memory.

Embodiments herein provide an electronic device having a memory module, a circuit board, a support plate, a holder, and a lid. The memory module has a memory mounted thereon. The support plate supports the circuit board. In this way, the circuit board is located facing and separated from the support plate. The support plate has an opening. The circuit board has a first contact. The holder has a box-like shape.

The holder has a first engagement portion and a recessed housing portion. The housing portion is formed so as to internally house the memory module. The first engagement portion is provided so as to be inserted into the opening and engage with the opening. The holder is configured to be fixed to the support plate in an attitude in which the housing portion is open toward the circuit board, by the first engagement portion engaging with the opening. The lid is mounted on the holder by being inserted into the housing portion. A conductive portion is provided on the lid. The conductive portion is configured to electrically connect the memory module to the first contact of the circuit board.

BRIEF DESCRIPTION OF THE DRAWINGS

Embodiments will be described below in detail with reference to the accompanying drawings in which.

DETAILED DESCRIPTION

Figure 5:
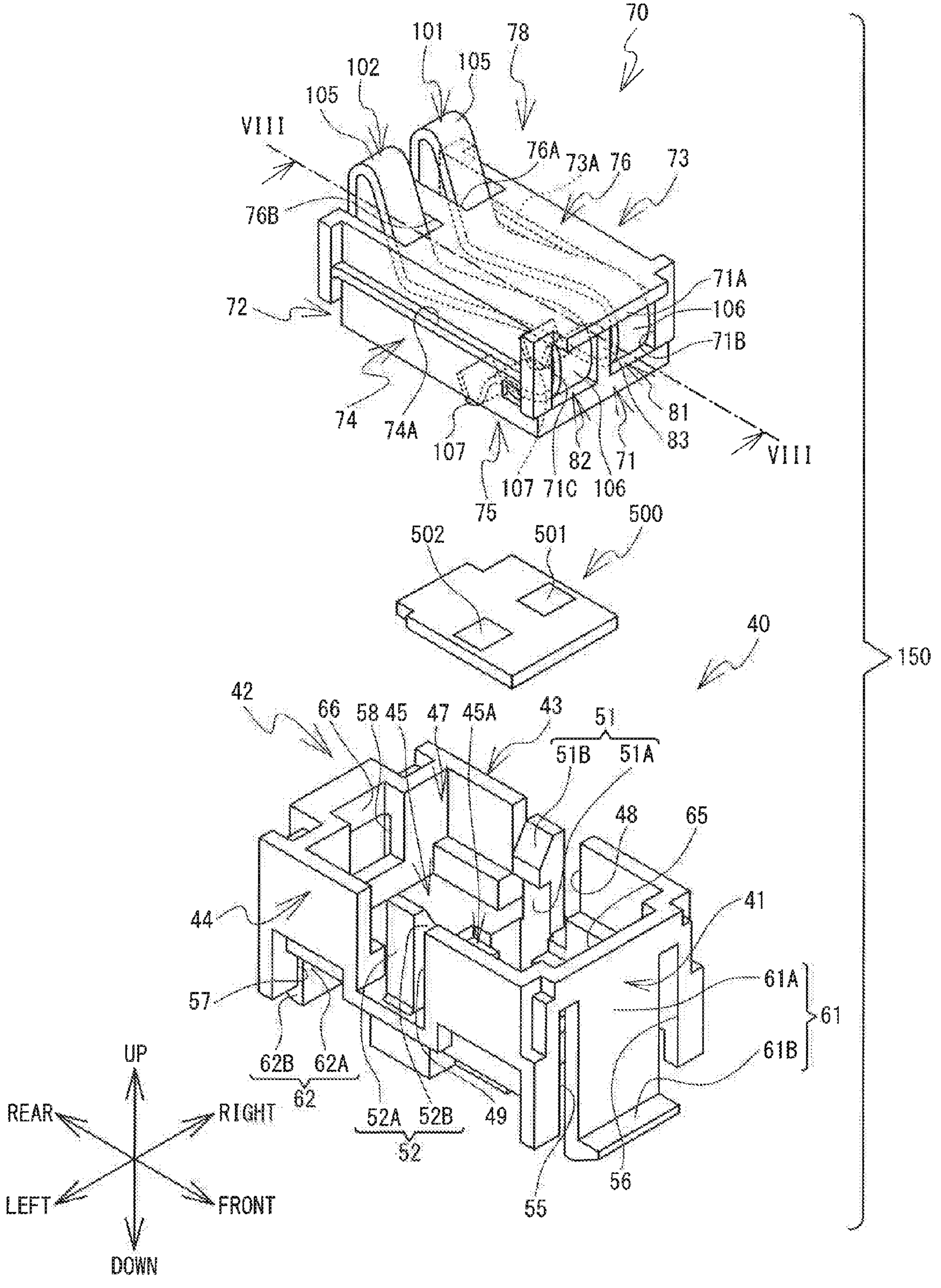
FIG. 5 is an exploded perspective view of a memory assembly.

In the following explanation, an up-down direction, a left-right direction and a front-rear direction indicated by arrows in the drawings are used. An orientation of a memory assembly 150 shown in FIG. 5 is defined for the purpose of explanation, and does not correspond to an orientation of a printer 1 shown in FIG. 1.

Figure 1:
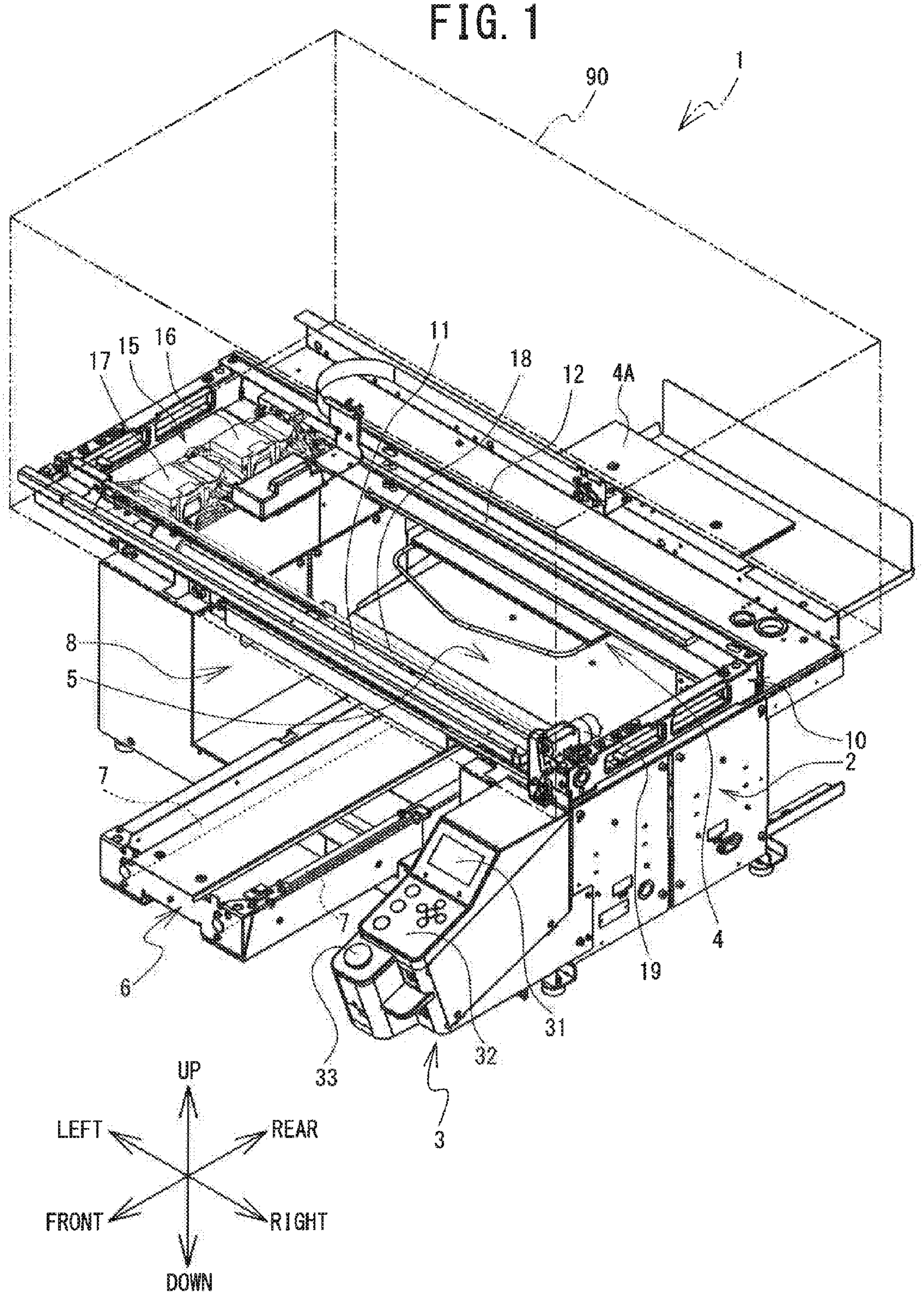
FIG. 1 is a perspective view of a printer.

An overview of a configuration of the printer 1 will be explained with reference to FIG. 1. The printer 1 is an inkjet printer that performs print by discharging liquid ink onto a print medium (not shown in the drawings). The print medium is a cloth, such as a T-shirt, for example. The printer 1 can print a color image on the print medium by discharging five types of ink (white (W), black (K), yellow (Y), cyan (C), and magenta (M)) in a downward direction. It is preferable that the printer 1 can improve the adhesion of the ink to the cloth by including a synthetic resin component in the ink.

The printer 1 is provided with a case body 2, a platen 4, a tray 5, a platen drive mechanism 6, a frame body 10, a guide shaft 11, a rail 12, a carriage 15, head units 16 and 17, a drive belt 18, an X-axis drive motor 19, an operation portion 3, and a main body cover 90 etc.

The case body 2 is formed as a substantially cuboid shape that is long in the left-right direction, and an opening 8, which has a substantially rectangular shape in a front view and which extends in the front-rear direction, is provided in substantially a center portion in the left-right direction of the case body 2. The platen 4, the tray 5, and the platen drive mechanism 6 are each provided inside the opening 8, in that order from the top downward. The platen 4 is provided below the frame body 10 that will be described later, and is formed as a plate that is substantially rectangular in a plan view and that is long in the front-rear direction. The platen 4 can retain a cloth, such as a T-shirt, for example, on a retention face 4A that is an upper portion of the platen 4. The tray 5 is provided below the platen 4, is formed as a plate that is substantially rectangular in a plan view, and is larger than the platen 4. When a user causes the T-shirt or the like to be retained on the platen 4, the tray 5 receives a sleeve or the like of the T-shirt and thus protects the sleeve or the like such that the sleeve or the like does not come into contact with other components inside the case body 2.

The platen drive mechanism 6 is provided on a bottom surface on the inside of the opening 8 and is formed as a substantially square plate that extends in the front-rear direction. A pair of guide rails 7 and 7, and a Y-axis drive motor (not shown in the drawings) are provided inside the platen drive mechanism 6. The pair of guide rails 7 and 7 are provided such that they are mutually separated from each other and extend in parallel in the front-rear direction, and they support the platen 4 and the tray 5 such that the platen 4 and the tray 5 can move in the front-rear direction. The platen drive mechanism 6 moves the platen 4 and the tray 5 in the front-rear direction along the pair of guide rails 7 and 7 as a result of driving of the Y-axis drive motor.

The frame body 10 is installed on an upper portion of the case body 2, and is a substantially rectangular frame that is long in the left-right direction. The frame body 10 supports the guide shaft 11 at the front and the rail 12 at the rear, respectively. The guide shaft 11 extends in the left-right direction on the inside of the frame body 10. The rail 12 is located facing the guide shaft 11 and extends in the left-right direction on the inside of the frame body 10. The carriage 15 is supported such that it can move in the left-right direction along the guide shaft 11 and the rail 12. The head units 16 and 17 are mounted on the carriage 15. Head portions (not shown in the drawings) that can discharge ink toward the print medium are provided on bottom portions of the head units 16 and 17, respectively.

A pair of pulleys (not shown in the drawings) are provided in a front right corner portion and a front left corner portion of the frame body 10. The drive belt 18 is an endless belt made of synthetic resin and is bridged between the pair of pulleys (not shown in the drawings). The X-axis drive motor 19 is connected to an axis of the pulley provided on the front right corner portion of the frame body 10. When the X-axis drive motor 19 drives in forward and backward directions, an inner surface of the drive belt 18 is moved in the left-right direction between the pair of pulleys. The carriage 15 is connected to the drive belt 18. Thus, the carriage 15 is moved in the left-right direction along with the drive belt 18. In accordance with the movement of the carriage 15, the head units 16 and 17 discharge ink toward the cloth retained on the retention face 4A of the platen 4, from their respective head portions. In this manner, a desired image is printed on the cloth.

The operation portion 3 is provided on the front right side of the case body 2, and is formed as a substantially square shape that protrudes to the front. The front side of the top surface of the operation portion 3 is provided as an inclined surface that inclines downward from the rear toward the front. A display panel 31, an operation panel 32, and a print start button 33 are respectively provided, in that order from the rear toward the front, on this inclined surface. The display panel 31 displays various information relating to operations. The operation panel 32 is operated when the user inputs instructions relating to various operations of the printer 1. The print start button 33 is depressed when starting print. An internal configuration of the operation portion 3 will be described later.

The main body cover 90 is formed as a substantially cuboid-shaped box that is open on the lower side, and is detachably attached to an upper portion of the case body 2. The main body cover 90 protects the various mechanisms arranged inside the frame body 10, such as the carriage 15, the head units 16 and 17 etc., by covering them from above. At the same time, when minute spray particles of ink are floating around the head units 16 and 17, the main body cover 90 prevents the spray particles from being dispersed outside.

Figure 2:
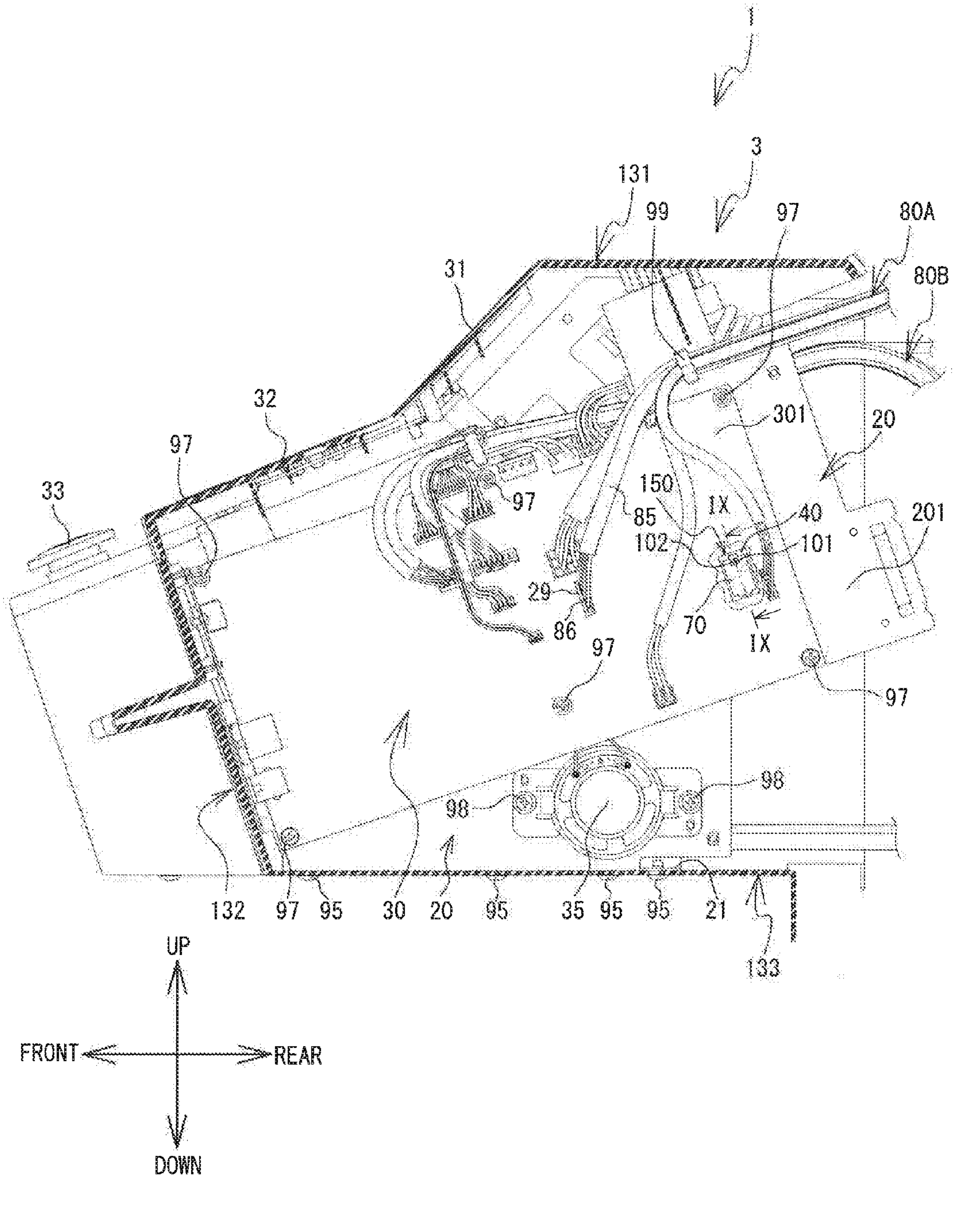
FIG. 2 is a longitudinal cross-sectional view of an operation portion.

The internal configuration of the operation portion 3 will be explained with reference to FIG. 2 to FIG. 4. As shown in FIG. 2, a support plate 20, a main board 30, and harness groups 80A and 80B etc. are respectively provided inside the operation portion 3. The support plate 20 is provided standing such that it is parallel to the front-rear direction. The support plate 20 supports the main board 30 in a position that is separated from and facing a predetermined area P that will be described later (refer to FIG. 3) of a right side surface 201. The main board 30 is a circuit board that is provided with a control circuit (not shown in the drawings). The control circuit is a circuit that controls operations of the printer 1 and is provided with a CPU, a ROM, and a RAM etc. Each of the harness groups 80A and 80B is formed by bundling a plurality of harnesses 85 that are connected to various electronic components provided in the printer 1. The harness groups 80A and 80B extend from the rear to the front of the operation portion 3. Connectors 86 of the harnesses 85 that branch off, respectively, from the harness groups 80A and 80B, are connected to a plurality of connector connection portions 29 (refer to FIG. 2) provided in the right side surface 201 of the main board 30.

A configuration of the support plate 20 will be explained with reference to FIG. 3, FIG. 4 and FIG. 10. The support plate 20 is a polygon-shaped plate made of synthetic resin that is formed along inner surfaces of each of a top wall 131, a side wall 132 and a bottom wall 133. The support plate 20 is provided with the right side surface 201 and a left side surface 202 (refer to FIG. 9). A fixation tab 21, which is bent at a substantial right angle to the left side, is provided on a lower end portion of the support plate 20. A position of the fixation tab 21 is determined on the top surface of the bottom wall 133, and it is fixed by a plurality of screws 95. In a similar manner, a fixation tab (not shown in the drawings) is provided on a top end portion of the support plate 20, its position is determined on the lower surface of the top wall 131, and it is fixed by a plurality of screws (not shown in the drawings). As a result, the support plate 20 is fixed such that it stands vertically inside the operation portion 3.

A bundling portion 99 is fixed to the rear side of an upper portion of the right side surface 201. The bundling portion 99 binds together the harness group 80A and fixes the harness group 80A to the right side surface 201 of the support plate 20. Further, in a similar manner, a bundling portion (not shown in the drawings), which binds together the harness group 80B and fixes the harness group 80B to the left side surface 202, is fixed to the left side surface 202. A speaker 35, which outputs audio, is fixed in the vicinity of the lower end portion of the right side surface 201 by a pair of screws 98. A pair of upper and lower openings 25 and 26 (refer to FIG. 4) are provided to the rear of the speaker 35. The opening 25 is provided on the upper side and the opening 26 is provided on the lower side.

Figure 9:
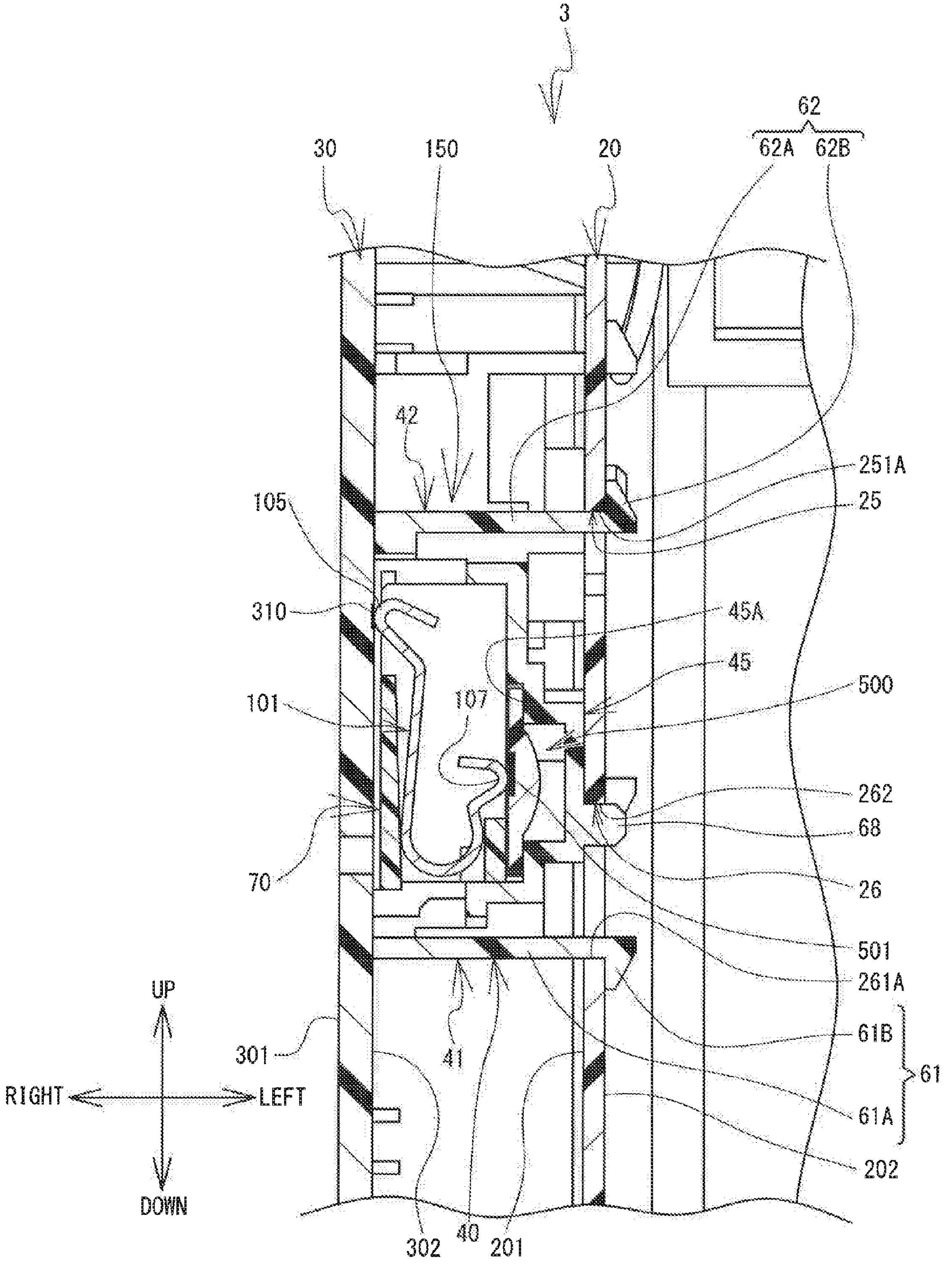
FIG. 9 is a cross-sectional view along a line IX-IX shown in FIG. 2.
Figure 10:
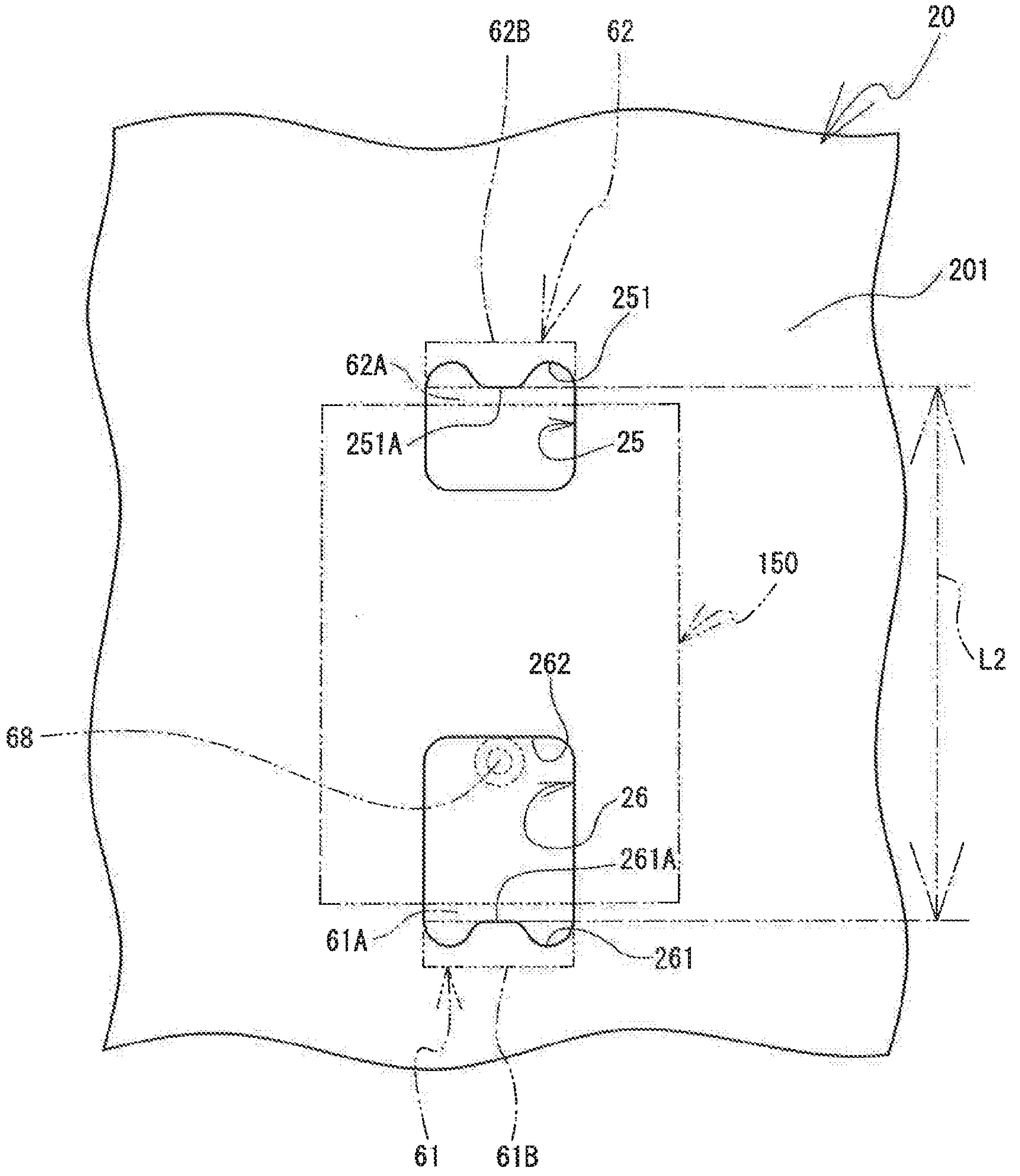
FIG. 10 is a diagram showing an opening provided in the support plate.

As shown in FIG. 10, each of the openings 25 and 26 is formed in a rectangular shape. The opening 26 is formed to be vertically longer than the opening 25. A protrusion 251A, which protrudes downward, is provided in a central portion of a top edge portion 251 of the opening 25. A protrusion 261A, which protrudes upward, is provided in a central portion of a bottom edge portion 261 of the opening 26. A pair of engagement portions 62 and 61 (refer to FIG. 5), which are provided on a holder 40 of the memory assembly 150 that will be described later, respectively engage with the openings 25 and 26. In this way, the memory assembly 150 is attached to the right side surface 201, as shown in FIG. 3. The memory assembly 150 is an assembly to store, on the inside, an additional memory 500 (refer to FIG. 5). The memory assembly 150 attached to the right side surface 201 is supported such that a pair of metal terminals 101 and 102, which cause the additional memory 500 to be electrically conductive, are exposed on the side of the main board 30. The pair of metal terminals 101 and 102 come into contact with a pair of contact portions 310 (refer to FIG. 9) that will be described later and that are provided on a left side surface 302 of the main board 30.

Figure 3:
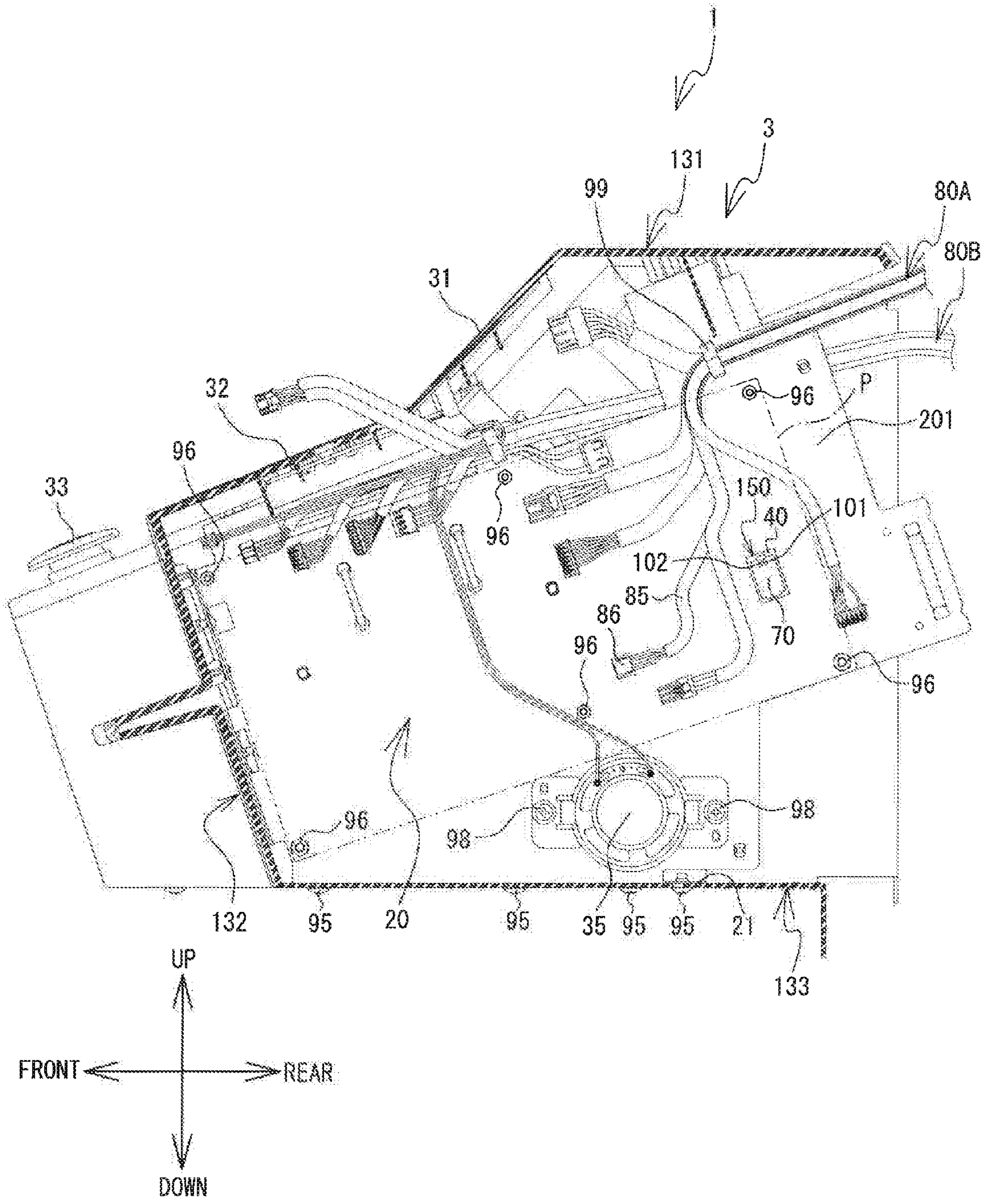
FIG. 3 is a diagram in which a main board is removed from a support plate shown in FIG. 2.
Figure 4:
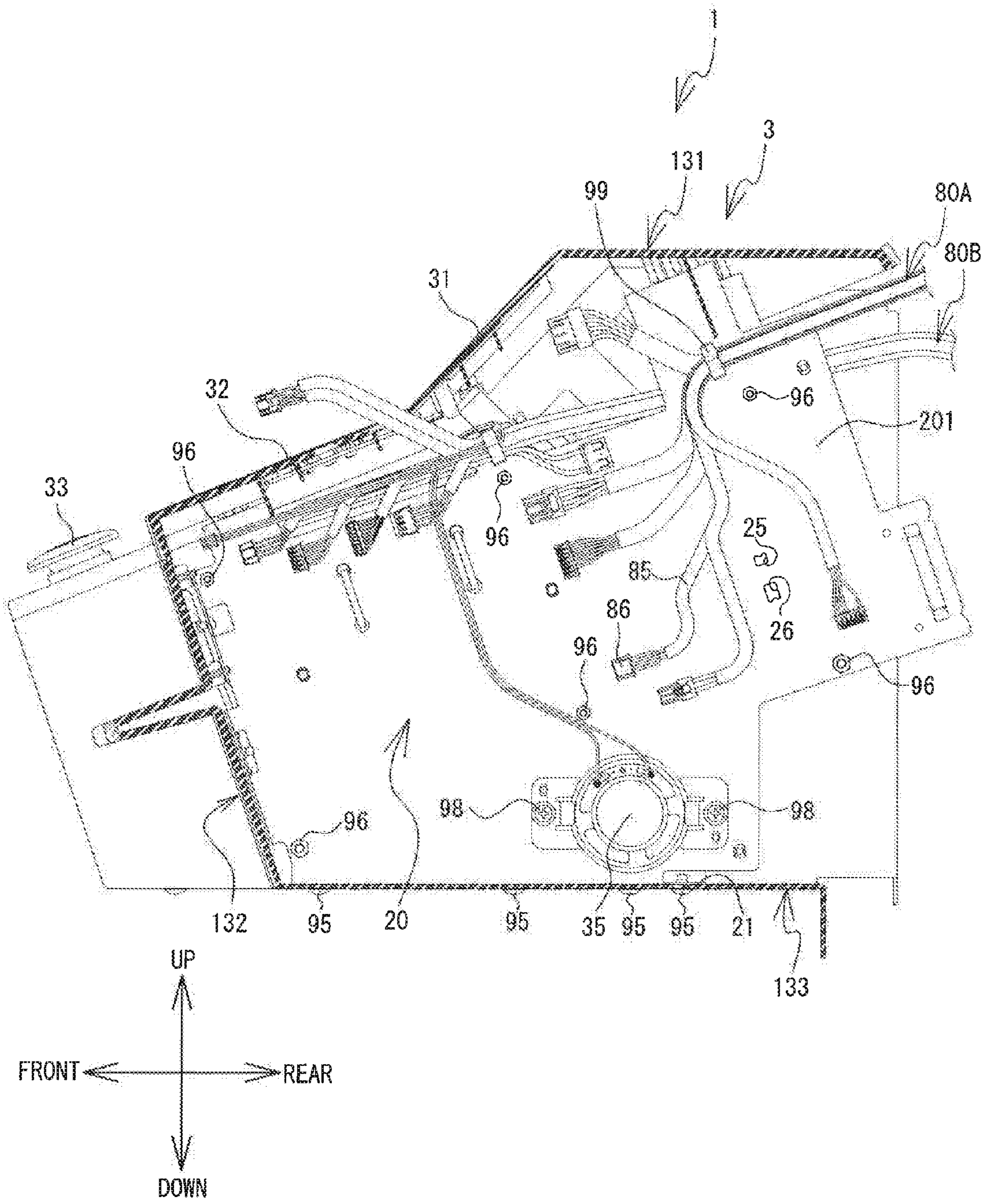
FIG. 4 is a diagram in which a holder is removed from the support plate shown in FIG. 3.

As shown in FIG. 3, on the right side surface 201, the predetermined area P, which is substantially rectangular and indicated by an alternate long and two short dashes line, is an area that is located facing the main board 30. At the four vertices of the predetermined area P, long tubular bolts 96 are respectively fixed by screws (not shown in the drawings), from the side of the left surface side 202, in a direction orthogonal to the right side surface 201. A length of the bolt 96 is 10 mm, for example, but the length is not limited to this example. The four vertices of the main board 30 are respectively provided to correspond to the four bolts 96, and four screws 97 are respectively fixed (refer to FIG. 2) from the side of a right side surface 301 of the main board 30. In this manner, the main board 30 is supported such that it faces the predetermined area P of the right side surface 201 in a position in which it is separated by 10 mm to the right side from the predetermined area P.

The configuration of the main board 30 will be explained with reference to FIG. 2. The main board 30 is formed in a horizontally long rectangular shape, and, as described above, is supported such that it faces the predetermined area P of the support plate 20 while being separated from the predetermined area P. The main board 30 is provided with the right side surface 301 and the left side surface 302. The main board 30 is provided with the plurality of connector connection portions 29 on the side of the right side surface 301, with the control circuit (not shown in the drawings) on the side of the left side surface 302, and with the pair of contact portions 310 (refer to FIG. 9, where only one of the contact portions 310 is illustrated) etc. The pair of contact portions 310 and the plurality of connector connection portions 29 are electrically connected to the CPU etc. of the control circuit. The left side surface 302 (refer to FIG. 9) of the main board 30 faces the right side surface 201 of the support plate 20. The pair of contact portions 310 come into contact with the pair of metal terminals 101 and 102 of the memory assembly 150 attached to the right side surface 201 of the support plate 20. In this way, the CPU (not shown in the drawings) of the control circuit can read out or write in data to and from the additional memory 500 housed inside the memory assembly 150, via the metal terminals 101 and 102.

The configuration of the memory assembly 150 will be explained with reference to FIG. 5. The memory assembly 150 is provided with the holder 40, the additional memory 500 and a lid member 70. The memory assembly 150 stores the additional memory 500 inside the holder 40, and the lid member 70 is mounted from above, thus configuring a substantially cuboid assembly.

The configuration of the holder 40 will be explained with reference to FIG. 5 to FIG. 7. The holder 40 is formed as a substantially cuboid-shaped box that is open on the upward side, and is integrally molded using synthetic resin. The holder 40 is provided with a front wall 41, a back wall 42, a right side wall 43, a left side wall 44, and a bottom wall 45. A housing portion 47 is formed inside the holder 40. The additional memory 500 is housed in the housing portion 47.

Two cut out grooves 55 and 56 are provided in the front wall 41 in the up-down direction. The cut out grooves 55 and 56 extend in a substantially straight line from a lower end portion of the front wall 41 to vicinity of a top end portion of the front wall 41, and extend in parallel to and separated from each other in the front-rear direction. The engagement portion 61 is provided between the cut out grooves 55 and 56. The engagement portion 61 is provided with an arm portion 61A and an engagement tab 61B. The arm portion 61A extends in a substantially straight line downward from the top end portion of the front wall 41, and is provided to protrude further downward than an outer surface of the bottom wall 45. The engagement tab 61B is provided on a lower end portion of the arm portion 61A, and is formed in a claw shape that protrudes to the front in a substantially triangular shape (refer to FIG. 7).

Two cut out grooves 57 and 58 are provided in the back wall 42 in the up-down direction. The cut out grooves 57 and 58 extend in a substantially straight line from a lower end portion of the back wall 42 to the vicinity of a top end portion of the back wall 42, and extend in parallel to and separated from each other in the front-rear direction. The engagement portion 62 is provided between the cut out grooves 57 and 58. The engagement portion 62 is provided with an arm portion 62A and an engagement tab 62B. The arm portion 62A extends in a substantially straight line downward from the top end portion of the back wall 42, and is provided to protrude further downward than the outer surface of the bottom wall 45. The engagement tab 62B is provided on a lower end portion of the arm portion 62A, and is formed in a claw shape that protrudes to the rear in a substantially triangular shape (refer to FIG. 7). The arm portion 61A of the engagement portion 61 and the arm portion 62A of the engagement portion 62 have a positional relationship in which they face each other in the front-rear direction and have the bottom wall 45 between them, and can elastically deform at least in a direction to come closer to each other.

A separation distance L1 (refer to FIG. 7) between the engagement portions 61 and 62 is adjusted to be equal to or larger than a separation distance L2 (refer to FIG. 10) between the pair of openings 25 and 26 of the support plate 20. The separation distance L1 is a distance from an outer surface of the arm portion 61A of the engagement portion 61 to an outer surface of the arm portion 62A of the engagement portion 62. The separation distance L2 is a distance from the protrusion 251A of the top edge portion 251 of the opening 25 to the protrusion 261A of the bottom edge portion 261 of the opening 26.

Figure 6:
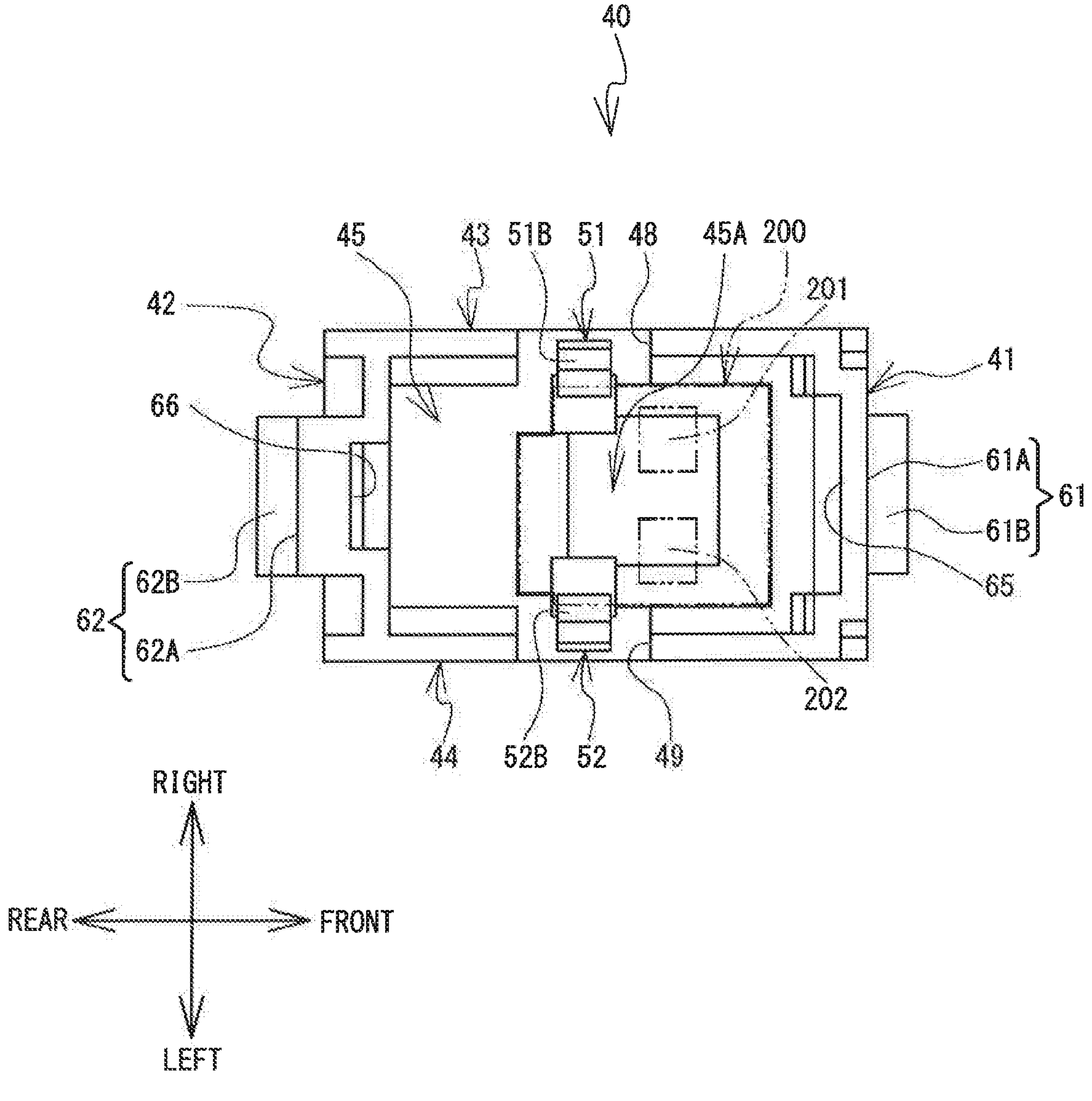
FIG. 6 is a plan view of the holder.

As shown in FIG. 5 and FIG. 6, a groove 48 that is open in a substantially rectangular shape is provided substantially in the center of the right side wall 43 in a width direction (the front-rear direction), from the upper end portion to the lower end portion of the right side wall 43. An engagement portion 51 is provided on the inside of the groove 48. The engagement portion 51 is provided with an arm portion 51A and an engagement tab 51B. The arm portion 51A is provided extending upward in a substantially straight line from a bottom surface inside the groove 48. The engagement tab 51B is provided on a top end portion of the arm portion 51A, and is formed in a claw shape that protrudes in a substantially triangular shape to the inside of the housing portion 47.

Figure 7:
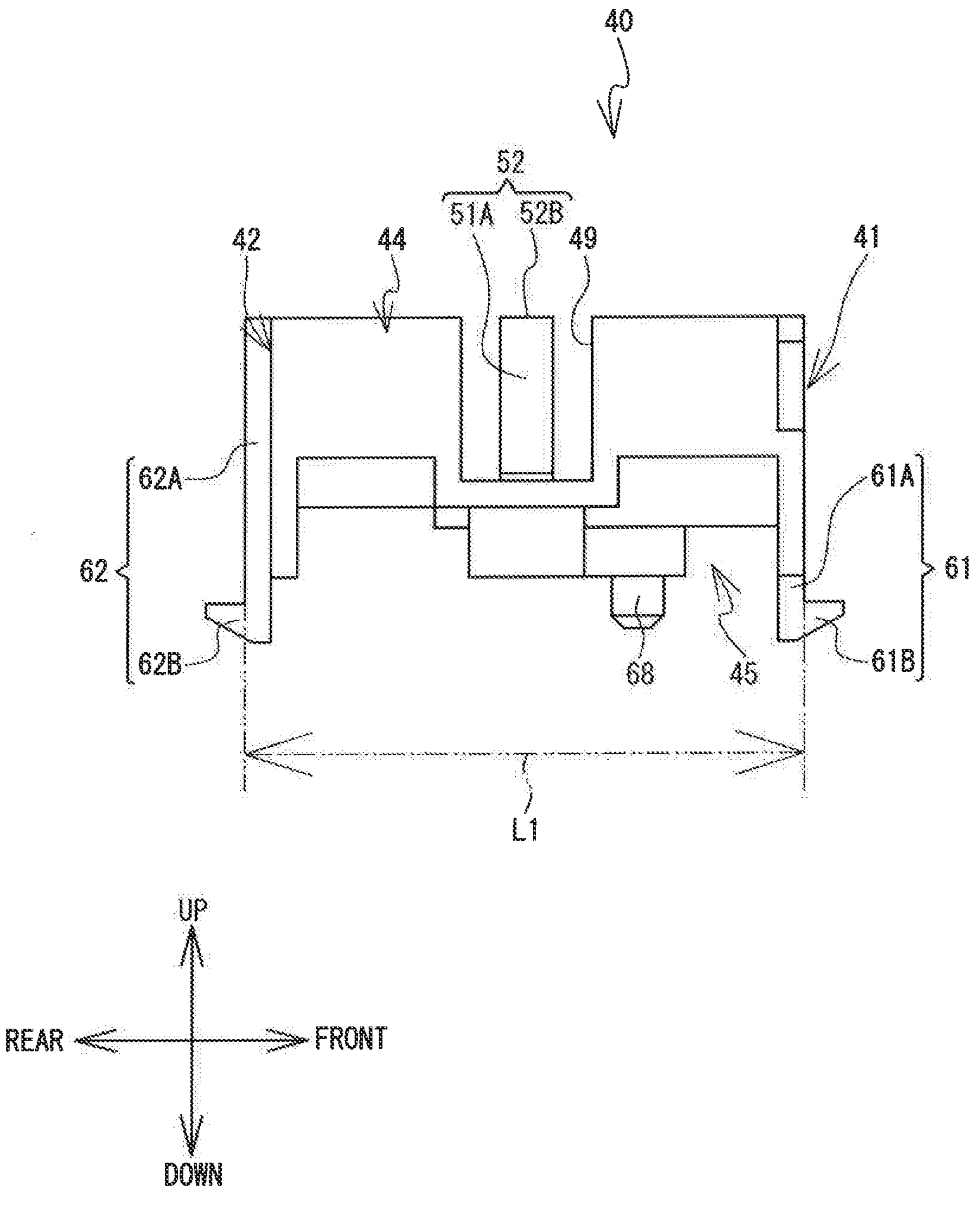
FIG. 7 is a left side view of the holder.

As shown in FIG. 5 to FIG. 7, a groove 49 that is open in a substantially rectangular shape is also provided substantially in the center of the left side wall 44 in the width direction (the front-rear direction), from the upper end portion to the lower end portion of the left side wall 44. An engagement portion 52 is provided on the inside of the groove 49. The engagement portion 52 is provided with an arm portion 52A and an engagement tab 52B. The arm portion 52A is provided extending upward from a bottom surface inside the groove 49. The engagement tab 52B is provided on a top end portion of the arm portion 52A, and is formed in a claw shape that protrudes in a substantially triangular shape to the inside of the housing portion 47. The arm portion 51A of the engagement portion 51 and the arm portion 52A of the engagement portion 52 have a positional relationship in which they face each other in the left-right direction and have housing portion 47 between them, and can elastically deform at least in a direction to come closer to each other.

As shown in FIG. 5 and FIG. 6, on the inside of the housing portion 47, a memory arrangement portion 45A is provided on the top surface of the bottom wall 45. The memory arrangement portion 45A is formed in a substantially rectangular shape in a plan view, such that it corresponds to an outer edge shape of the additional memory 500, and is one step lower than other portions of the top surface of the bottom wall 45 apart from the memory arrangement portion 45A. A recess portion 65 is provided extending in the up-down direction in a substantially center portion in a width direction (the left-right direction) of an inner surface of the front wall 41. The recess portion 65 is formed by being hollowed out in a substantially rectangular shape toward the front. A protrusion 71A (to be described later) of the lid member 70 is inserted into the inside of the recess portion 65 from above. A recess portion 66 is provided extending in the up-down direction in a substantially center portion in the width direction (the left-right direction) of an inner surface of the back wall 42. The recess portion 66 is formed by being hollowed out in a substantially rectangular shape toward the rear. A protrusion 72A (to be described later, refer to FIG. 8) of the lid member 70 is inserted into the inside of the recess portion 66 from above. As shown in FIG. 7, a substantially cylindrical projection portion 68, which protrudes downward, is provided on a lower surface of the bottom wall 45, in a position that is displaced toward the side of the engagement portion 61 from a substantially center portion.

The additional memory 500 will be explained with reference to FIG. 5. The additional memory 500 is formed as a plate having a substantially rectangular shape in a plan view, and is formed by a plurality of semi-conductor memory chips (not shown in the drawings) being mounted on a substrate and wired. Connection terminals 501 and 502 are provided such that they are aligned to the left and right in substantially the center on one face of the additional memory 500. The connection terminals 501 and 502 are electrically connected to the plurality of semi-conductor memory chips, and are terminals for forming an electrical connection to the outside. Curved portions 107 and 107 of the pair of metal terminals 101 and 102 (to be described later) of the lid member 70 mounted on the housing portion 47 respectively come into contact with the connection terminals 501 and 502 (refer to FIG. 9, where only the connection terminal 501 is illustrated).

The configuration of the lid member 70 will be explained with reference to FIG. 5 to FIG. 7. As shown in FIG. 5, the lid member 70 is provided with a case body 78, and the metal terminals 101 and 102. The case body 78 is made of synthetic resin, is formed in a substantially cuboid shape, and is provided with a front surface 71, a back surface 72, a right side surface 73, a left side surface 74, a bottom surface 75, and a top surface 76. A partition wall 83 is provided substantially in the center of a hollow portion inside the case body 78. The partition wall 83 is a plate that extends in the front-rear direction, and is provided such that it stands vertically. A terminal housing portion 81 is formed on the right side of the partition wall 83, and a terminal housing portion 82 is formed on the left side of the partition wall 83. The metal terminal 101 is housed in the terminal housing portion 81 and the metal terminal 102 is housed in the terminal housing portion 82.

The protrusion 71A is provided on a top portion of the front surface 71, substantially in the center in the width direction (the left-right direction). The protrusion 71A is formed as a plate that is substantially rectangular in a plan view and that protrudes substantially horizontally to the front. Rectangular openings 71B and 71C are provided such that they are aligned in the left-right direction below the protrusion 71A. The opening 71B communicates with the terminal housing portion 81, and the opening 71C communicates with the terminal housing portion 82. The protrusion 72A (refer to FIG. 8) is provided on a top portion of the back surface 72, substantially in the center in the width direction (the left-right direction). The protrusion 72A is formed as a plate that is substantially rectangular in a plan view and that protrudes substantially horizontally to the rear. Two grooves 76A and 76B are provided such that they are aligned in the left-right direction on the rear end side of the top surface 76. The grooves 76A and 76B respectively communicate with the terminal housing portions 81 and 82, and are provided such that they extend from the rear end side of the top surface 76 and go around to the front end side of the back surface 72 and the bottom surface 75 (refer to FIG. 8).

A front end portion and a rear end portion of the left side surface 74 are formed protruding further to the left than an intermediate section that excludes the front end portion and the rear end portion. A rib 74A is provided substantially in a middle stage position, in the up-down direction, of the intermediate section. The rib 74A extends in the front-rear direction and protrudes to the left. Similarly to the left side surface 74, a front end portion and a rear end portion of the right side surface 73 are also formed protruding further to the right than an intermediate section that excludes the front end portion and the rear end portion. Similarly to the rib 74A, a rib 73A is provided substantially in a middle stage position, in the up-down direction, of the intermediate section, and the rib 73A extends in the front-rear direction and protrudes to the right.

Figure 8:
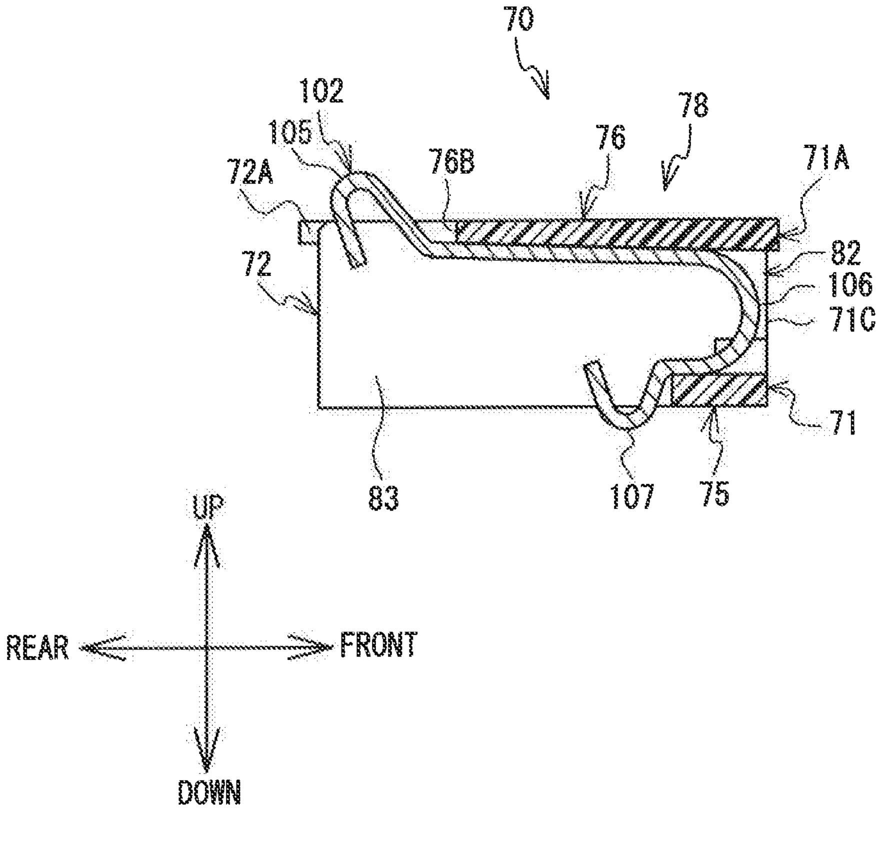
FIG. 8 is a cross-sectional view along a line VIII-VIII shown in FIG. 5.

The metal terminals 101 and 102 are plate springs made of metal. The metal terminals 101 and 102 are formed in a C shape in a side view, and are housed in the terminal housing portions 81 and 82 of the case body 78, such that the inside of the metal terminals 101 and 102 is open and facing to the rear. The metal terminals 101 and 102 are each provided with curved portions 105, 106, and 107. As shown in FIG. 8, when the metal terminal 102 is viewed from the left side, the curved portion 105 is provided on an end portion on the upper side of the metal terminal 102 that extends toward the rear, and is a section that is curved upward in an arch shape. The curved portion 106 is a section on the front side of the metal terminal 102 that forms a large arc-shaped curve. The curved portion 107 is provided on an end portion on the lower side of the metal terminal 102 that extends toward the rear, and is a section that is curved downward in an arch shape. The metal terminal 101 has the same shape as the metal terminal 102. When the metal terminals 101 and 102 are respectively housed in the terminal housing portions 81 and 82 of the case body 78, the curved portions 105 and 105 of the metal terminals 101 and 102 respectively protrude upward from the grooves 76A and 76B of the top surface 76. Further, the curved portions 107 and 107 of the metal terminals 101 and 102 protrude downward from the grooves 76A and 76B in the bottom surface 75.

A method of assembly of the memory assembly 150 will be explained with reference to FIG. 5 and FIG. 9. As shown in FIG. 5, first, the additional memory 500 is inserted into the housing portion 47 of the holder 40, and is arranged on the memory arrangement portion 45A of the bottom wall 45. Next, the bottom surface 75 side of the lid member 70 is caused to face downward, and the lid member 70 is inserted, from above, into the housing portion 47 in which the additional memory 500 is arranged. At that time, the protrusion 71A of the lid member 70 is inserted into the recess portion 65 of the holder 40, and the protrusion 72A is inserted into the recess portion 66. In this way, the lid member 70 is guided to a correct position inside the housing portion 47 along a longitudinal direction of the recess portions 65 and 66.

In addition, when the lid member 70 is inserted into the housing portion 47, the ribs 73A and 74A that are respectively provided on the right side surface 73 and the left side surface 74 come into contact, respectively, with head portions of the engagement tabs 51B and 52B of the engagement portions 51 and 52 of the holder 40. Further, when the lid member 70 is pressed into the housing portion 47, the arm portions 51A and 52A of the engagement portions 51 and 52 elastically deform and are pushed such that they spread outward. Then, when the ribs 73A and 74A pass the engagement tabs 51B and 52B of the engagement portions 51 and 51 in the downward direction, the arm portions 51A and 52A return to their original shape due to the elastic force, and the engagement tabs 51B and 52B are engaged on the top surfaces of each of the set of ribs 73A and 74A. In this way, the lid member 70 is mounted while the additional memory 500 is housed inside the housing portion 47, and the assembly of the memory assembly 150 is complete. On the inside of the memory assembly 150, the curved portions 107 of each of the metal terminals 101 and 102 that protrude downward from the bottom surface 75 of the lid member 70 are in contact, respectively, with the connection terminals 501 and 502 of the additional memory 500 (refer to FIG. 9).

A method of attaching the memory assembly 150 to the support plate 20 will be explained with reference to FIG. 4, FIG. 9, and FIG. 10. As shown in FIG. 4, first the holder 40 side of the memory assembly 150 is caused to face the pair of openings 25 and 26 from the side of the right side surface 201 of the support plate 20 to which the main board 30 is not fixed. At that time, the orientation of the memory assembly 150 is adjusted such that the engagement portion 62 faces the upper opening 25 and the engagement portion 61 faces the lower opening 26, respectively.

Next, the engagement portions 62 and 61 are respectively inserted into and caused to engage with the openings 25 and 26. As described above, the separation distance L1 between the engagement portions 61 and 62 is slightly larger than the separation distance L2 (refer to FIG. 10) between the openings 25 and 26 of the support plate 20. Here, the arm portion 62A of the engagement portion 62 and the arm portion 61A of the engagement portion 61 are grasped by hand and are bent in a direction such that they come closer together, such that a separation distance between the engagement tab 62B and the engagement tab 61B becomes narrower. In this state, the engagement tab 62B is inserted into the opening 25, and the engagement tab 61B is inserted into the opening 26. After the engagement tabs 62B and 61B have been inserted into the openings 25 and 26, the arm portions 62A and 61A return to their original shape due to the elastic force, by removing the hand from the arm portions 62A and 61A. At that time, as shown in FIG. 9 and FIG. 10, the engagement tab 62B engages with the protrusion 251A of the top edge portion 251 of the opening 25. The engagement tab 61B engages with the protrusion 261A of the bottom edge portion 261 of the opening 26. In this way, the engagement portion 62 engages with the opening 25 and the engagement portion 61 engages with the opening 26.

As shown in FIG. 10, the projection portion 68 provided on the bottom wall 45 of the holder 40 is inserted into the lower opening 26, and thus, the bottom wall 45 of the holder 40 is in a state of being in contact with the right side surface 201 of the support plate 20. In this way, the attachment of the memory assembly 150 to the right side surface 201 of the support plate 20 is complete (refer to FIG. 3). The projection portion 68 engages with a top edge portion 262 of the opening 26, and can thus prevent positional displacement of the memory assembly 150 in the up-down direction.

A case is possible in which the user mistakenly attaches the memory assembly 150 with a reverse orientation in the up-down direction with respect to the pair of openings 25 and 26. When the memory assembly 150 is attached with the reverse orientation in the up-down direction, positions of the metal terminals 101 and 102 that are exposed to the side of the lid member 70 change, and it is thus not possible to cause the metal terminals 101 and 102 to come into contact with the pair of contact portions 310 of the main board 30 that is attached later. Here, in the present embodiment, the projection portion 68 of the holder 40 is provided in a position further to the side of the engagement portion 61 than the substantial center of the bottom wall 45, and the opening 25 is formed to be smaller than the opening 26. As a result, when the memory assembly 150 is attached with the reverse orientation in the up-down direction, the projection portion 68 cannot be inserted into either the opening 25 or the opening 26 of the support plate 20. Accordingly, the engagement portions 61 and 62 cannot be caused to engage with the openings 25 and 26, and thus, the memory assembly 150 cannot be attached to the support plate 20. In this way, it is possible to prevent the attachment of the memory assembly 150 on the support plate 20 in an orientation different to the predetermined orientation.

Next, as shown in FIG. 2, using the four screws 97, the main board 30 is fixed to the right side surface 201 of the support plate 20 to which the memory assembly 150 has been attached, such that the main board 30 faces the predetermined area P. As described above, since the memory assembly 150 is attached to the support plate 20 in the predetermined orientation, the pair of contact portions 310 provided on the left side surface 302 of the main board 30 are reliably caused to come into contact with positions of the curved portions 105 and 105 of the metal terminals 101 and 102 exposed to the side of the lid member 70.

When fixing the main board 30 to the right side surface 201 of the support plate 20, the curved portions 105 and 105 of the metal terminals 101 and 102 are pressed into the side of the support plate 20. As the metal terminals 101 and 102 are the plate springs, they deform elastically. Thus, for example, even if there is an attachment error of the main board 30 with respect to the support plate 20, or there is positional displacement of the lid member 70 inside the holder 40, the metal terminals 101 and 102 deform elastically in accordance with a distance of separation between the main board 30 and the support plate 20, and it is thus possible to reliably cause contact between the connection terminals 501 and 502 of the additional memory 500 and the pair of contact portions 310 of the main board 30. In this way, the attachment of the memory assembly 150 to the support plate 20 is complete.

For example, when the printer 1 is improved and a number of the head portions mounted on each of the head units 16 and 17 is increased, there is a case in which it is wished to additionally install, on the main board 30, a memory storing the model code of the printer 1 after improvement. There are restrictions on the size of the main board 30 due to space provided inside the printer 1, and it is therefore difficult to additionally install the memory on the main board 30 using a soldering iron or a joint etc.

Here, in the present embodiment, the memory assembly 150 that houses the additional memory 500 can be attached to the support plate 20 that supports the main board 30, and the metal terminals 101 and 102 that are electrically conductive to the additional memory 500 inside the memory assembly 150 can be caused to come into contact with the contact portions 310 of the main board 30. In this way, the CPU of the control circuit provided on the main board 30 can read out and write in data to and from the additional memory 500 housed in the memory assembly 150. As a result, even if there is no space on the main board 30, by attaching the memory assembly 150 to the support plate 20, the memory can be easily additionally installed with respect to the main board 30.

As explained above, the printer 1 of the present embodiment is provided with the support plate 20, the main board 30, and the memory assembly 150. The support plate 20 is provided so that it is separated from and facing the main board 30, and supports the main board 30. The pair of openings 25 and 26 are provided in the support plate 20. The memory assembly 150 is provided with the holder 40 and the lid member 70. The holder 40 is formed as a box shape, and has the housing portion 47 that internally houses the additional memory 500, and the engagement portions 62 and 61 that engage with the openings 25 and 26. In a state in which the engagement portions 62 and 61 are engaged with the openings 25 and 26, the open side of the housing portion 47 of the holder 40 is provided facing the side of the main board 30. The lid member 70 is mounted on the housing portion 47, and has the metal terminals 101 and 102. The metal terminals 101 and 102 respectively come into contact with the additional memory 500 inside the housing portion 47 and the contact points 310 of the main board 30, and thus cause them to be mutually electrically conductive. In this way, the main board 30 can read out and write in data to and from the additional memory 500 housed in the memory assembly 150, via the metal terminals 101 and 102. As a result, even if there is no space on the main board 30, it is possible to easily attach the additional memory 500.

Further, in the present embodiment, the engagement portions 61 and 62 are respectively provided on the mutually facing front wall 41 and back wall 42 of the holder 40. The openings 25 and 26 respectively correspond to the engagement portions 62 and 61. Thus, the memory assembly 150 can be attached to the right side surface 201 of the support plate 20 in a stable manner.

In addition, in the present embodiment, the engagement portion 61 is provided with the arm portion 61A and the engagement tab 61B. The arm portion 61A is extendingly provided such that it protrudes further than the bottom wall 45 of the holder 40 in the direction opposite to the open side of the housing portion 47, and the arm portion 61A can deform elastically in a direction such that the pair of engagement portions 61 and 62 come closer to each other. The engagement tab 61B is provided on a leading end portion of the arm portion 61A in an extending direction of the arm portion 61A, and the engagement tab 61B engages with the bottom edge portion 261 of the opening 26. The engagement portion 62 also has the same shape as the engagement portion 61. Therefore, by using the elastic force of the arm portions 61A and 62A, the engagement portions 61 and 62 can cause the engagement tabs 61B and 62B to reliably engage with the bottom edge portion 261 of the opening 26 and the top edge portion 262 of the opening 25.

Furthermore, in the present embodiment, the separation distance L1 between the engagement portions 61 and 62 is equal to or larger than the separation distance L2 between the openings 25 and 26, and thus, by bending the engagement portions 61 and 62 and causing them to deform elastically, it is possible to cause the engagement portions 61 and 62 to reliably engage with the openings 25 and 26.

In addition, in the present embodiment, the housing portion 47 is provided with the pair of engagement portions 51 and 52 on the right side surface 43 and the left side surface 44 of the holder 40. The engagement portions 51 and 52 respectively engage with the ribs 73A and 74A of the lid member 70. As a result, the lid member 70 can be reliably mounted in a state in which the additional memory 500 is housed in the housing portion 47, and the additional memory 500 inside the housing portion 47 can thus be held.

Furthermore, in the present embodiment, in the holder 40, a direction in which the pair of engagement portions 51 and 52 are aligned with each other is orthogonal to a direction in which the pair of engagement portions 61 and 62 are aligned with each other. In other words, the engagement portions 61 and 62 and the engagement portions 51 and 52 are arranged in mutually different positions and it is thus possible to easily cause the deformation of the engagement portions 61 and 62 and the engagement portions 51 and 52, respectively.

In addition, in the present embodiment, the engagement portion 51 is provided with the arm portion 51A and the engagement tab 51B. The arm portion 51A is provided such that it extends in the direction opposite to the extending direction of the arm portion 61A of the engagement portion 61, and the arm portion 51A can deform elastically in a direction such that the pair of engagement portions 51 and 52 separate from each other. The engagement tab 51B is provided on a leading end portion of the arm portion 51A in the extending direction of the arm portion 51A, and the engagement tab 51B engages with the rib 73A provided on the right side surface 73 of the lid member 70. The engagement portion 52 also has the same shape as the engagement portion 51. Therefore, by using the elastic force of the arm portions 51A and 52A, the engagement portions 51 and 52 can cause the engagement tabs 51B and 52B to reliably engage with the ribs 73A and 74A provided on the right side surface 73 and the left side surface 74 of the lid member 70.

Further, in the present embodiment, the projection portion 68 is provided on the outer surface of the bottom wall 45 of the holder 40. In a state in which the pair of engagement portions 62 and 61 are engaged with the pair of openings 25 and 26, the projection portion 68 is inserted into the opening 26 that is larger than the opening 25. Specifically, the projection portion 68 is only inserted into the opening 26 when the pair of engagement portions 62 and 61 engage with the pair of openings 25 and 26, and the holder 40 is attached to the support plate 20 in the correct orientation. As a result, it is possible to prevent the mistaken orientation of the holder 40 that is attached to the support plate 20.

Furthermore, in the present embodiment, the metal terminals 101 and 102 are plate springs made of metal. The metal terminals 101 and 102 are interposed between the pair of contact portions 310 of the main board 30 and the pair of connection terminals 501 and 502 of the additional memory 500. Thus, due to the elastic force of the plate springs, it is possible to reliably connect and cause conductivity between the pair of contact portions 310 and the pair of connection terminals 501 and 502.

In addition, in the present embodiment, the main board 30 is provided with the pair of contact portions 310 on the left side surface 302, and is provided with the connector connection portions 29 on the right side surface 301. The support plate 20 is provided such that it is separated from and facing the left side surface 302 of the main board 30. As a result, the harnesses 85 are not disposed on the left side surface 302 of the main board 30, and it is easy to cause the metal terminals 101 and 102 of the lid member 70 mounted on the holder 40 to come into contact with the pair of contact portions 310 of the main board 30.

Furthermore, in the present embodiment, the operation portion 3, which receives operations of the user, is provided. Inside the operation portion 3, space for the many harness groups 80A and 80B etc. that are connected to the main board 30 is limited. As there is the attachment structure for the additional memory 500, as described above, in this type of the operation portion 3, the memory can easily be additionally installed with respect to the main board 30.

Further, in the present embodiment, the platen 4 that retains the cloth, and the main body cover 90 that covers the head units 16 and 17, which discharge fluid onto the cloth retained by the platen 4 in accordance with print data and based on an operation of the operation portion 3, are provided. The operation portion 3 is provided on the outside of the main body cover 90. The printer 1 is a printer for cloth that discharges the fluid ink onto the cloth, and thus, taking a thickness of the cloth etc. into consideration, a gap between the head units 16 and 17 and the cloth is relatively large.

There is a possibility that a fine mist (spray) of the ink can float inside the main body cover 90. If it is assumed that the mist attaches to the main board 30 and causes a short circuit, there is a case in which the main board 30 does not operate normally. If the main board 30 does not operate normally, there is a possibility of a deterioration in print quality. Here, in the printer 1 for cloth according to the present embodiment, the main board 30 is provided inside the operation portion 3 that is provided on the outside of the main cover body 90, and thus the main board 30 can be separated from the mist. In this type of the printer 1 for cloth, the above-described attachment structure for the additional memory 500 is provided inside the operation portion 3, and thus the additional memory 500 can easily be attached with respect to the main board 30.

The present disclosure is not limited to the above-described embodiment and various modifications can be made to the above-described embodiment insofar as they do not depart from the spirit and scope of the present disclosure. The above-described embodiment is the printer 1 for cloth, but the printer 1 may be a printer that uses paper or the like as its print medium. The present disclosure is not limited to a printer and can also be applied to a general electronic device.

In the above-described embodiment, the pair of openings 25 and 26 are provided in the support plate 20, and the single memory assembly 150 is attached to the openings 25 and 26, but a number of the memory assemblies 150 attached to the support plate 20 may be increased by increasing a number of pairs of openings.

In the above-described embodiment, the pair of openings 25 and 26 are provided in the support plate 20, the engagement portions 62 and 61 of the memory assembly 150 are respectively engaged with the pair of openings 25 and 26, and the outer surface of the bottom wall 45 of the holder 40 is caused to come into contact with the right side surface 201 of the support plate 20. For example, a single rectangular opening may be provided in the support plate 20 and the engagement portions 62 and 61 of the memory assembly 150 may respectively be caused to engage with a pair of mutually facing edge portions of the opening, among edges of the opening. In the case of this modified example, the engagement portions 62 and 61 may be respectively caused to engage with the pair of edge portions of the opening in a state in which the holder 40 is inserted into the opening.

In the above-described embodiment, the openings 25 and 26 are provided such that they are separated from each other in the up-down direction in the support plate 20, and the memory assembly 150 is attached in a vertical orientation, but the orientation of the memory assembly 150 may be changed by changing the arrangement of the pair of openings 25 and 26. For example, the openings 25 and 26 may be provided such that they are separated from each other in the front-rear direction, and the memory assembly 150 may be attached in a horizontal orientation.

In the above-described embodiment, the projection portion 68 is provided on the outer surface of the bottom wall 45 of the holder 40, but the projection portion 68 may be omitted. Further, in the above-described embodiment, the opening 26 also functions as a "hole portion" into which the projection portion 68 is inserted, but the "hole portion" may be independently provided in the support plate 20 separately from the opening 26. In this case, the opening 26 may be the same size as the opening 25, for example.

In the above-described embodiment, the lid member 70 is provided with the two metal terminals 101 and 102, but a number of metal terminals may be one or may be two or more. Further, the metal terminals 101 and 102 are plate springs, but a curvature shape is not limited to that of the above-described embodiment.

In the above-described embodiment, the support plate 20, the main board 30, and the memory assembly 150 are provided inside the operation portion 3, but they may be provided in another location.

The apparatus and methods described above with reference to the various embodiments are merely examples. It goes without saying that they are not confined to the depicted embodiments. While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

What is claimed is:

1. An electronic device comprising:
- a memory module having a memory mounted thereon;
- a circuit board having a first contact on one surface of the circuit board, and a connection portion to which a wiring connector is connected on another surface of the circuit board;
- a lid having a conductive portion configured to electrically connect the memory module to the first contact of the circuit board;
- a support plate configured to support the circuit board in a state in which the one surface of the circuit board is located facing and separated from the support plate, the support plate having an opening; and
- a holder having a box-like shape and including a recessed housing portion formed to house the memory module therein, the holder comprising:
  - a pair of first side walls facing each other in a first direction,
  - a pair of first engagement portions provided to be inserted into and engaged with the opening, one of the pair of first engagement portions being provided on one of the pair of first side walls, and another of the pair of first engagement portions being provided on another of the pair of first side walls, wherein the first engagement portion includes a first arm portion provided extending so as to protrude further than a bottom wall of the holder in a second direction, the second direction being a direction opposite to the direction in which the housing portion is open, and the first arm portion being formed to be capable of elastically deforming such that a leading end portion of the first arm portion in the second direction swings along the first direction, and a first engagement tab provided on the leading end portion of the first arm portion so as to engage with the opening, a pair of second side walls facing each other in a third direction, the third direction being orthogonal to the first direction and the second direction, a pair of second engagement portions which are provided so as to face each other in the third direction, wherein each of the pair of second engagement portions is formed so as to engage with each of a pair of engaged portions provided on a pair of side surfaces of the lid, one of the pair of second engagement portions being provided on one of the pair of second side walls, and another of the pair of second engagement portions being provided on another of the pair of second side walls, wherein the second engagement portion includes a second arm portion provided extending in a fourth direction, the fourth direction being a direction in which the housing portion is open, and the second arm portion being formed to be elastically deformable such that a leading end portion of the second arm portion in the fourth direction swings along the third direction, and a second engagement tab provided on the leading end portion of the second arm portion so as to engage with the engaged portion, and a projection portion provided protruding in the second direction from the bottom wall, the projection portion being provided between the pair of first engagement portions, wherein the holder is fixed to the support plate in an attitude in which the housing portion is open towards the circuit board by the first engagement portion engaging with the opening, wherein the lid is mounted on the holder by being inserted into the housing portion, and wherein a hole portion into which the projection portion is inserted is provided in the support plate.

2. The electronic device according to claim 1, wherein the lid is configured to hold the memory module between the holder and the lid by being inserted into the housing portion and mounted on the holder, and the conductive portion has a second contact configured to be in contact with the first contact and a third contact configured to be in contact with the memory module.

3. The electronic device according to claim 2, wherein the conductive portion is formed by a metal plate spring, the second contact is provided on one end side of the plate spring, and the third contact is provided on another end side of the plate spring.

4. The electronic device according to claim 1, wherein a pair of the openings are provided in the support plate so as to correspond to the pair of first engagement portions.

5. The electronic device according to claim 4, wherein before elastic deformation of the pair of first engagement portions, a separation distance between the pair of first engagement portions is formed to be equal to or greater than a separation distance between the pair of openings.

6. The electronic device according to claim 1, wherein one of the pair of openings includes the hole portion into which the projection portion is inserted.

7. The electronic device according to claim 1, wherein a pair of the openings are provided in the support plate so as to correspond to the pair of first engagement portions, and one of the pair of openings includes the hole portion into which the projection portion is inserted.

8. The electronic device according to claim 1, further comprising:

an operation portion configured to receive an operation by a user; wherein the circuit board, the support plate, the holder, and the lid are provided in the operation portion.

9. The electronic device according to claim 8, further comprising:

a main body cover;

a case body to which the main cover body is attachable;

a retention portion provided inside the case body so as to retain a print medium; and an ink discharge portion provided inside the main body cover; wherein the ink discharge portion is configured to discharge ink onto the print medium held by the retention portion based on an operation received by the operation portion, and the operation portion is provided on the outside of the main body cover.

* * * * *